United States Patent [19]

Sugimoto

[11] Patent Number: 4,584,557
[45] Date of Patent: Apr. 22, 1986

[54] QUANTIZER-SUBTRACTOR CIRCUIT

[75] Inventor: Yasuhiro Sugimoto, Yokohama, Japan

[73] Assignee: Tokyo Shibaura Denki Kabushiki Kaisha, Japan

[21] Appl. No.: 587,128

[22] Filed: Mar. 7, 1984

[30] Foreign Application Priority Data

Mar. 30, 1983 [JP] Japan .................................. 58-54302

[51] Int. Cl.[4] .............................................. H03M 1/14
[52] U.S. Cl. ............................... 340/347 AD; 307/361
[58] Field of Search .................. 340/347 AD; 307/361

[56] References Cited

U.S. PATENT DOCUMENTS 4,179,687  12/1979  van de Plassche et al. ......... 340/347 AD

OTHER PUBLICATIONS van de Plassche et al., "A High-Speed 7 Bit A/D Converter," IEEE Journal of Solid-State Circuits, vol. SC-14, No. 6, Dec. 1979.

Primary Examiner—L. T. Hix
Assistant Examiner—David M. Gray
Attorney, Agent, or Firm—Finnegan, Henderson, Farabow, Garrett & Dunner

[57] ABSTRACT

A quantizer-subtractor circuit is provided with a input circuit for inputting an input signal and a circuit for producing a digital signal corresponding to the input signal. The quantizer-subtractor circuit contains $2^n$ transistors. These transistors are supplied with different bias voltages by a bias circuit. A control circuit is connected to the transistors and the input circuit and controls the currents passing through the $2^n$ transistors. A circuit produces as a subtraction output a signal corresponding to the difference between the controlled currents passing through the transistors applied with the bias voltages having odd-ordered magnitudes and the currents flowing through the transistors applied having bias voltages with the even-ordered magnitudes.

10 Claims, 8 Drawing Figures

QUANTIZER-SUBTRACTOR CIRCUIT

BACKGROUND OF THE INVENTION

The present invention relates to improvements of a quantizer-subtractor circuit of a two-step A/D converter.

Figure 1:
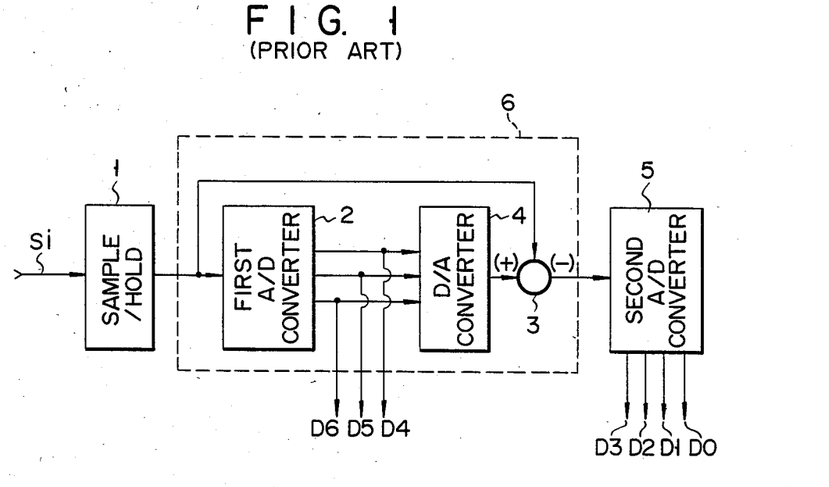
FIG. 1 is a block diagram of a prior art two-step A/D converter.

A variety of types of A/D converters have been known. Of those types of A/D converters, the two-step A/D converter exhibits high-speed performance and a simple construction, as shown in FIG. 1, for example. An analog input signal Si is sampled and held by a sample/hold circuit 1. The held signal is input into a first A/D converter 2 and also into a minus input terminal (−) of a subtractor circuit 3. The first A/D converter 2 A/D converts the analog input to digital signals of 3 bits D6, D5, and D4. A D/A converter 4 D/A converts the digital signals D6–D4 and applies the converted ones to a plus input terminal (+) of the subtractor 3.

A second A/D converter 5 A/D converts the output signal of the subtractor 5 into digital signals of 4 bits D3–D0.

Figure 2:
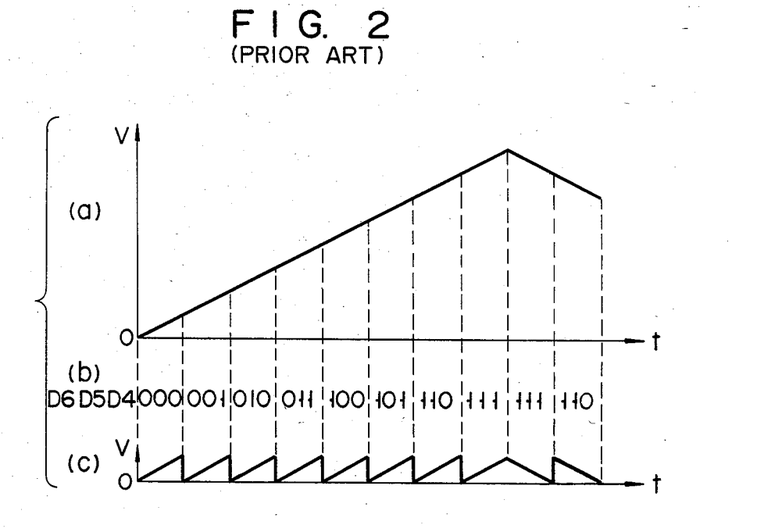
FIGS. 2(a), 2(b) and 2(c) are waveforms in explaining the operation of the A/D converter of FIG. 1.

When the input signal Si takes a triangle waveform as shown in FIG. 2(a), the first A/D converter 2 produces digital signals of 3 bits D6–D4, as shown in FIG. 2(b). The D/A converter 4 converts such digital signals derived from the A/D converter 2 to an analog signal and applies it to the subtractor 3. Then, the subtractor 3 produces a signal taking a waveform as shown in FIG. 2(c). The second A/D converter 5 A/D converts the signal of FIG. 2(c) and produces digital signals D3–D0 of 4 bits, for example. The final A/D converted signal takes the digital form of 7 bits: the three upper bits of the first A/D converter 2 and the four lower bits of the second A/D converter 5.

A high speed converting operation is ensured when parallel-conversion type A/D converters are used for the A/D converters 2 and 5. The number of comparators required when the A/D converting operation is carried out in a two-step fashion is remarkably reduced as compared with parallel-conversion type A/D converter used in a one-step fashion. Therefore, the total A/D converter is simple in construction.

Figure 3:
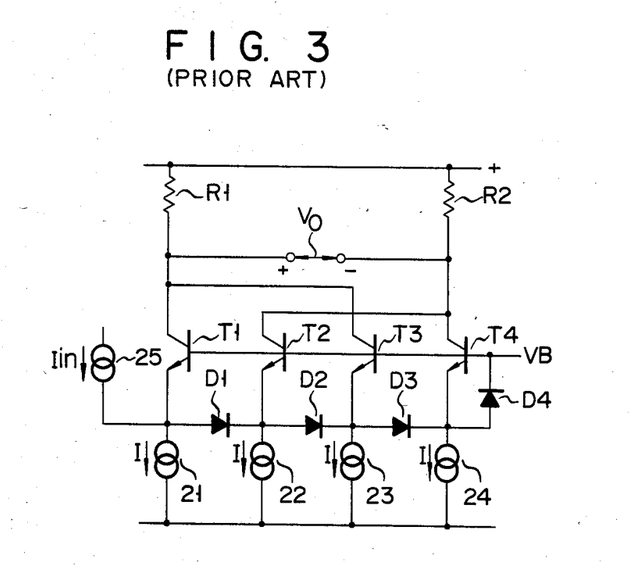
FIG. 3 is a circuit diagram of a prior art quantizer-subtractor circuit.
Figure 4:
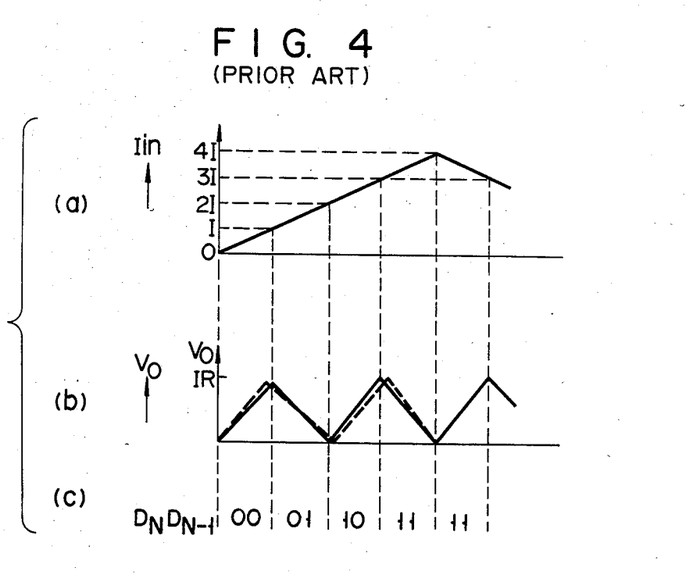
FIGS. 4(a), 4(b) and 4(c) are waveforms in explaining the operation of the quantizer-subtractor circuit shown in FIG. 3.

A circuit section containing the first A/D converter 2, the D/A converter 4, and the second A/D converter 6 can be simplified into a quantizer-subtractor circuit 6. This approach is found in "IEEE JOURNAL OF SOLID—STATE CIRCUITS" VOL. SC—14, No. 6, DECEMBER 1979, P938–943. The related part of the paper is expressly referred to in this specification. FIG. 3 is a circuit diagram of the quantizer-subtractor circuit which is shown on page 939, FIG. 2(a) in the above paper. FIGS. 4(a) and 4(b) correspond to the waveform diagrams of the input current Iin, and subtraction output voltage Vo, as shown in FIG. 2(b) on the same page. In operation of the circuit in FIG. 3, in response to an input signal, the input current Iin of an analog input current source 25 will vary as shown in FIG. 4(a). When the input current Iin is 0, equal currents I flow through transistors T1–T4. Therefore, resistors R1 and R2 with the equal resistance R have voltage drops of 2IR, respectively. Under this condition, the subtraction output Vo will be zero. When $0 < Iin < I$, all the currents I flow into a constant current source 21. With an increase of the input current Iin, the current of the transistor T1 decreases, and the current flowing through the resistor R1 also decreases. As a result, the subtraction output Vo increases, as indicated by the continuous line in FIG. 4(b). When $I \leq Iin < 2I$, the current I from the analog input current source 25 flows into the constant current source 21, turning off the transistor T1. increase of the input current Iin increases the current of the diode D1, while it decreases the currents flowing through the transistor T2 and the resistor R2. The result is a decrease in the voltage Vo, as indicated by a solid line in FIG. 4(b). A similar operation is repeated. When $2I \leq Iin\ 3I$, an increase of the input current Iin increases the current of the diode D2. The current of the transistor T3 decreases, and no current flows into the transistor T1 and T2. When $3I \leq Iin < 4I$, the current of the diode D3 increases with the increase of the input current Iin, but the current of the transistor T4 decreases. No current flows into the transistors T1–T3. The result is the plot of the subtraction output voltage Vo as indicated by a continuous line in FIG. 4(b).

For taking out an A/D converted output from this circuit, one of the possible approaches is to detect a voltage across the diode by a suitable means, for example, by comparators, to check a combination of the detected results by an encoder, and to produce an A/D conversion output signal. In this case, the A/D converted outputs $D_N$ and $D_{N-1}$ encoded are: "00" when the diodes D1–D3 are all OFF; "01" when the diode D1 is ON, but the diodes D2 and D3 are OFF; "10" when the diodes D1 and D2 are ON, but the diode D3 is OFF; "11" when the diodes D1–D3 are all ON. This is illustrated in FIG. 4(c).

The subtraction output voltage Vo, as indicated by a solid line in FIG. 4(b), increases with an increase of the current Iin in the intervals $0 \leq Iin < I$ and $2I \leq Iin < 3I$. It decreases with an increase of the input current Iin in the intervals $I \leq Iin < 2I$ and $3I \leq Iin < 4I$. In the case when the subtraction output voltage Vo is A/D converted by the second A/D converter (noted as 5 in FIG. 1) and the converted outputs are used as the lower bits, it is sufficient to invert the output bits in the intervals where the subtraction output decreases with the increase of the input current Iin (viz., where the A/D converted outputs $D_N$ and $D_{N-1}$ of the quantizer-subtractor circuit are "01" or "11" and are used as the upper bits).

Alternatively, a couple of the quantizer-subtractor circuits of FIG. 3 may coupled with each other in a parallel fashion, followed by the combination of the encoder and the comparator, as shown in FIG. 3 on page 939 in the above paper. This alternative arrangement can provide three or more bits of the A/D converter. In a quantizer-subtractor circuit thus arranged, when Iin=4I, the current of 3I flows through the diode D1, the current of 2I flows through the diode D2, and the current I flows through the diode D3. In other words, different currents flow through the diodes D1–D3, respectively. This makes the current densities and the forward voltages of the diodes D1–D3 different. The result is that the cutoff point of each of the transistors T2–T4 changes or fluctuates. Accordingly, the A/D converted outputs $D_N$ and $D_{N-1}$ change at the non-corresponding values of the input current Iin. In other words, the A/D converted output signal does not exactly correspond to a variation of the input current Iin. The waveform of the subtraction output voltage Vo is also deformed, as shown in FIG. 4(b), from its exact waveform.

One of the effective solutions to the cutoff-point shifting problem is to set the forward voltages at equal values. To effect this, the carrier storage effects of the diodes must be set equal to each other. This is realized as diode D1 is geometrically larger than diode D2, and that similarly diode D2 is geometrically larger than diode D3. More specifically, when Iin=4I, for example, the effective PN junction area of diode D1 is three times that of the diode D1; and the effective junction area of the diode D2 is two times that of the diode D3. In this approach, however, when Iin=3I, the forward voltages of the diodes are not equal. Therefore, the equalizing of the forward voltages of those diodes D1-D3 attained by this solution is a mere approximation.

The effective junction area of the PN junction finally changes depending on various conditions. For this reason, in manufacturing the diodes, it is very difficult to geometrically change the effective junction area of each diode D1-D3. Furthermore, when the number of diodes is increased with the increase of the bit number of the A/D conversion, equalizing of the forward voltages of those diodes is made even more difficult.

SUMMARY OF THE INVENTION

Accordingly, an object of the present invention is to provide a quantizer-subtractor circuit which can accurately perform a quantizing and subtracting operation with diodes geometrically equalized in design and manufacture.

According to the present invention, there is provided a quantitizer-subtractor circuit comprising: analog signal inputting means for inputting an analog input signal; digital signal outputting means for producing a digital signal corresponding to said analog signal input by the analog signal inputting means; $2^n$ transistors (n is an integer); bias means connected to said $2^n$ transistors for applying different bias voltages to each base of said $2^n$ transistors; controlling means connected to said $2^n$ transistors and the analog signal inputting means for controlling current passing through said $2^n$ transistors based on the analog-input signal input by said analog signal inputting means and on bias voltages applied to the bases of said $2^n$ transistors by said bias means; and analog signal producing means for producing an analog signal corresponding to difference between the total value of the currents flowing through the transistors of the $2^n$ transistors, which are supplied with bias voltages with odd-ordered magnitudes applied by the bias means, and the total value of the currents flowing through the transistors of the $2^n$ transistors, which are supplied with the bias voltages with even-ordered magnitudes applied by said bias means, in order that an analog signal corresponding to the difference between the value of the analog input signal input by said analog signal inputting means and the value corresponding to the digital signal output by said digital signal outputting means is produced.

Such an arrangement successfuly overcomes the disadvantages of the prior art, such as the change or fluctuation of the cut-off points of the $2^n$ transistors. Therefore, the digital outputs after the A/D conversion also take exact values. Further, the current flowing through the load resistor faithfully follows a variation of an input signal, thus securing a highly precise subtraction output, viz., a highly accurate quantizer-subtraction operation. Additionally, in designing a quantizer-subtractor circuit according to the present invention, there is no need to change the effective junction areas of the diodes used to get an improved quantizer-subtracting operation.

DETAILED DESCRIPTION OF THE PREFERRED EMBODIMENTS

One embodiment of the present invention will be described with reference to FIGS. 5 and 6(a) to 6(f).

Figure 5:
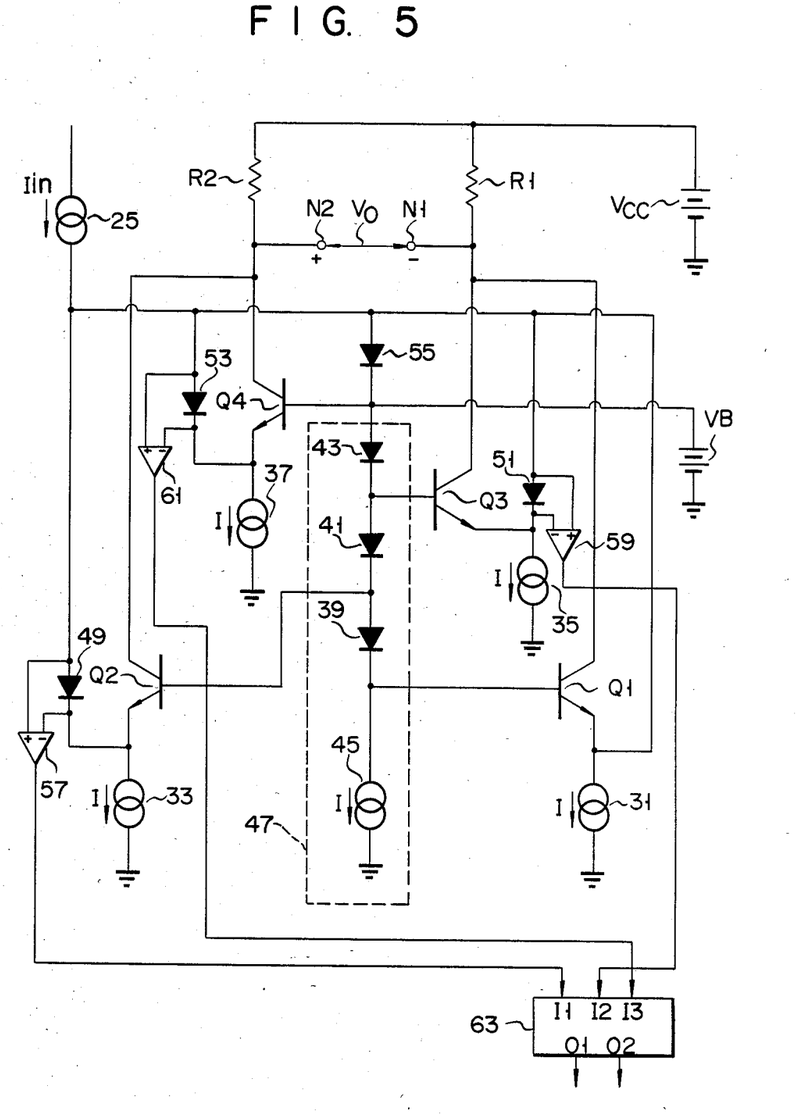
FIG. 5 is a circuit diagram of a quantizer-subtractor circuit which is an embodiment of the present invention.

In FIG. 5, the same reference numerals are used for designating like or equivalent portions as in FIG. 3. In the configuration of FIG. 3, a first transistor Q1 is connected at the collector to a power source Vcc via a load resistor R1, and grounded at the emitter via a first constant current source 31. A second transistor Q2 is connected at the collector to the power source Vcc via a load resistor R2, and at the emitter is grounded through a second constant current source 33. A third transistor Q3 is connected at the collector to the collector of the first transistor Q1, and at the emitter grounded through a third constant current source 35. A fourth transistor Q4 is connected at the collector to the collector of the second transistor Q2, and at the emitter grounded by way of a fourth constant current source 37. A positive output terminal of a bias power source with voltage VB is connected to the base of the transistor Q4 and grounded through a bias circuit 47 formed by a series circuit containing fourth to sixth diodes 39, 41 and 43 and a fifth constant current source 45. A junction of the diode 39 and the fifth constant current source 45 is connected to the base of the transistor Q1. A junction of the diodes 39 and 41 is connected to the base of the transistor Q2. A junction of the diodes 41 and 43 is connected to the base of the transistor Q3.

The output terminal of the analog input constant current source 25 is directly connected to the emitter of the first transistor Q1, and to the emitter of the second transistor Q2 via a first diode 49. The same output terminal is connected via a second diode 51 to the emitter of the third transistor Q3, and to the emitter of the fourth transistor Q4 via a third diode 53. Further, the output terminal is connected to the base of the fourth transistor Q4 via a protective diode 55. The anode of the first diode 49 is connected to the positive input terminal of a comparator 57, and its cathode is connected to a negative input terminal.

The output terminal of the comparator 57 is connected to the input terminal I1 of an encoder 63. The anode of the second diode 51 is connected to the positive input terminal of a comparator 59, and its cathode is connected to a negative input terminal of the comparator 59. The comparator 59 is connected at the output terminal to the input terminal I2 of the encoder 63. The anode of the third diode 53 is connected to the positive input terminal of the comparator 61. The cathode of the third diode 53 is coupled with the negative input terminal of the comparator 61. The output terminal of the comparator 61 is connected to the input terminal I3 of the encoder 63. The subtraction output voltage Vo represents the difference in voltage between the output terminal N1 connecting to a junction among the collectors of the first and third transistors Q1 and Q3, and the output terminal N2 connecting to a junction of the collectors of the second and fourth transistors Q2 and Q4. The resistors R1 and R2 have equal resistance values R. The current value of each of the constant current sources 31, 33, 35, 37 and 45 is I.

The operation of the quantitizer-subtractor circuit will be described referring to FIGS. 6(a)–6(g). The analog input constant current source 25 produces an input current Iin proportional to an analog input signal. The description of the operation to follows is limited within a specific interval 0 to 4I of a triangular wave of the input current Iin shown in FIG. 6(a), for simplicity.

Figure 6:
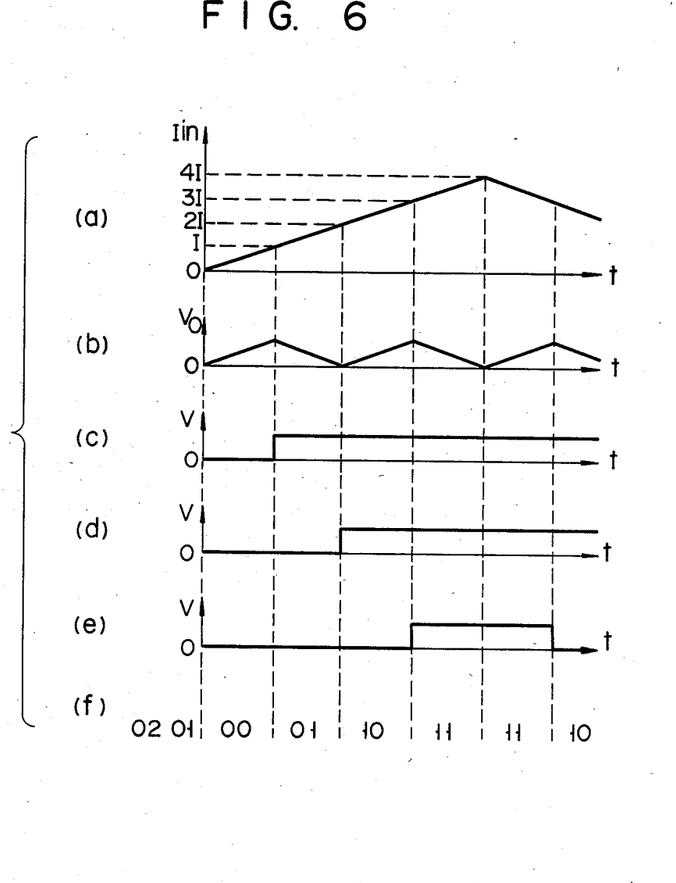
FIGS. 6(a), 6(b), 6(c), 6(d), 6(e) and 6(f) show a set of waveforms illustrating a sequence of operations of the quantizer-subtractor circuit of FIG. 5.

(a) Iin=0:

Current I flows into the collector-emitter path of each of the first to fourth transistors Q1 to Q4. Accordingly, current 2I flows into the resistor R1 and R2. Resistors R1 and R2 have each a voltage drop 2IR. Therefore, the voltages at the output terminals N1 and N2 are equal to each other, and the subtraction output voltage Vo is 0, as shown in FIG. 6(b). No current flows into the first to third diodes 49, 51 and 53, thus providing no voltage drop. The outputs of the comparators 57, 59 and 61 are at L (low) level, as shown in FIGS. 6(c), 6(d) and 6(e) respectively. Under this condition, an L level signal is input to the input terminals I1 to I3 of the encoder 63, which in turn produces a digital signal "00". In this case, if the emitter potential of the first transistor Q1 is 1 V, the base potential is 1+VBE=1+0.7=1.7 V. VBE is the voltage between the base and emitter of the transistor of NPN type. Then, the base potential of the second transistor Q2 is given by 1.7+VF=1.7+0.7=2.4 V. VF is a forward voltage drop of the diode. Then, the emitter potential of the second transistor Q2 is given by 2.4−VBE=1.7 V. The emitter voltage of the third transistor Q3 is 2.4+VF−VBE=2.4 V. The emitter voltage of the fourth transistor Q4 is 2.4+VF+VF−VBE=3.1 V.

(b) 0<Iin<I:

The input current Iin flows into the first constant current source 31 connected to the lowest emitter potential point. With an increase in the input current Iin, the current flowing through the collector-emitter path of the first transistor Q1 decreases. The current of the resistor R1 also decreases. Then, the voltage drop of the resistor R1 decreases, and the voltage at the output terminal N1 increases. The current of the resistor R2 remains unchanged. This means that the voltage at the output terminal N2 is constant. Therefore, the subtraction output voltage Vo rises, as shown in FIG. 6(b). Also in this case, since no current flows into the first to third diodes 49, 51 and 53, no voltage drop generated across each diodes 49, 51 and 53. As shown in FIGS. 6(c)–6(e), the output signals of the comparators 57, 59 and 61 are at L level. As a consequence, the encoder 63 produces a digital signal of "00".

(c) I≦Iin<2I:

A portion I of the input current Iin flows into the constant current source 31. The result is that no current flows into the collector-emitter path of the first transistor Q1, and the transistor Q1 is turned off. The current (Iin−I) flows into the second constant current source 33, via the first diode 49 connecting to the lowest potential point of emitter potentials of the transistors Q2–Q4. Then, the current of the second transistor Q2 and the resistor R2 decreases with the increase of the current Iin. In turn, the voltage drop across the resistor R2 decreases and the voltage at the terminal N2 rises. At this time, the voltage drop across the resistor R1 is unchanged, and the voltage at the output terminal N1 is constant. Therefore, the subtraction output voltage Vo gradually decreases as shown in FIG. 6(b). The current flows into the first diode 49 and causes a voltage drop across the diode 49. The comparator 57 detects this voltage drop and produces and H high level signal, as shown in FIG. 6(c). No current flows into the second and third diodes 51 and 53, and the comparators 59 and 61 produce L level signals, as shown in FIGS. 6(d) and 6(e). The result is the inputting of an H level signal to the input terminal I1 of the encoder 63 and an L level signal to the input terminals I2 and I3. Finally, the encoder 63 produces a digital signal "01", as shown in FIG. 6(f).

(d) 2I≦Iin<3I:

A portion I of the input current Iin flows to the constant current source 31 and another portion I flows to the constant current source 33. Then, the first and second transistors Q1 and Q3 are cut off. The emitter potential of the third transistor Q3 is lower than that of the fourth transistor Q4. Accordingly, current Iin−2I flows into the constant current source 35 via the diode 51 connected to the emitter of the third transistor Q3. With the increase of the input current Iin, the current of the collector-emitter path of the third transistor Q3 decreases. The result is a decrease in the current flowing through the resistor R1 and in the voltage drop across the resistor R1. Further, the voltage at the output terminal N1 rises. At this time, the current of the resistor R2 is unchanged, and the voltage at the output terminal N2 is constant. Under this condition, the subtraction output voltage Vo rises as shown in FIG. 6(b). In this case, current flows into the first and second diodes 49 and 51 and cause the voltage drops across the diodes 49 and 51. Then, the comparators 57 and 59 each produce an H level signal, as shown in FIG. 6(c) and 6(d). No current flows into the third diode, so that the comparator 61 produces an L level signal, as shown in FIG. 6(e). Upon receipt of these signals, the encoder 63 produces a digital signal "10", as shown in FIG. 6(f).

(e) 3I≦Iin<4I:

In this current interval, portion I of the input current Iin flows to the constant current source 31, portion I flows to constant current source 33 and portion I flows to the constant current source 35. With this type of current flow, the transistor Q3 is also turned off in addition to the first and second transistors Q1 and Q2. The remaining current (Iin−3I) flows into the fourth constant current source 37, through the third diode 53. Accordingly, with an increase of the input current Iin, the current flowing through the collector-emitter path of the transistor Q4 decreases. The result is that the current of the resistor R2 decreases and the voltage drop across the resistor R2 decreases. Then, the voltage at the output terminal N2 rises. During this, the current of the resistor R1 is constant and the voltage at the output terminal N1 is constant. Thus, the subtraction output voltage Vo decreases as shown in FIG. 6(b). In this case, the current flows into the first, second and third diodes 49, 51 and 53, causing the voltage drop. The comparators 57, 59 and 61 detect these voltage drops and produce H level signals, as shown in FIGS. 6(c)–6(e). Upon receipt of those signals, the encoder 63 produces logical signals "11", as shown in FIG. 6(f).

In this way, the 2-bit digital signals, exactly corresponding to the analog input signal, are obtained. The subtraction output voltage Vo corresponding to the difference between the value of the analog signal and the value corresponding to the output digital signal. The subtraction output thus obtained is similar to that of the quantizer-subtractor circuit shown in FIG. 3. For this reason, when the subtraction output Vo, after it is A/D converted, is used as the lower bits, those bits must logically be inverted during the period where the subtraction output voltage Vo decreases with the increase of the input current Iin, viz., in the interval where the digital signals derived from the encoder 63 are "01" and "11".

With such an arrangement of the quantizer-subtractor circuit, the peak values of the currents flowing into the diodes 49, 51 and 53, which are connected correspondingly to the emitters of the second to fourth transistors Q2–Q4, are equal to each other, I. This fact implies that the characteristics of the diodes and the transistors as well are set equal to each other, and that the circuit design is simplified. Further, the current flowing through each resistor R1 and R2 exactly changes by I against a change of the input current Iin for each interval $0-I$, $I-2I$, $2I-3I$, and $3I-4I$. Thus, a high-precision quantizer-subtractor circuit is provided.

Figure 7:
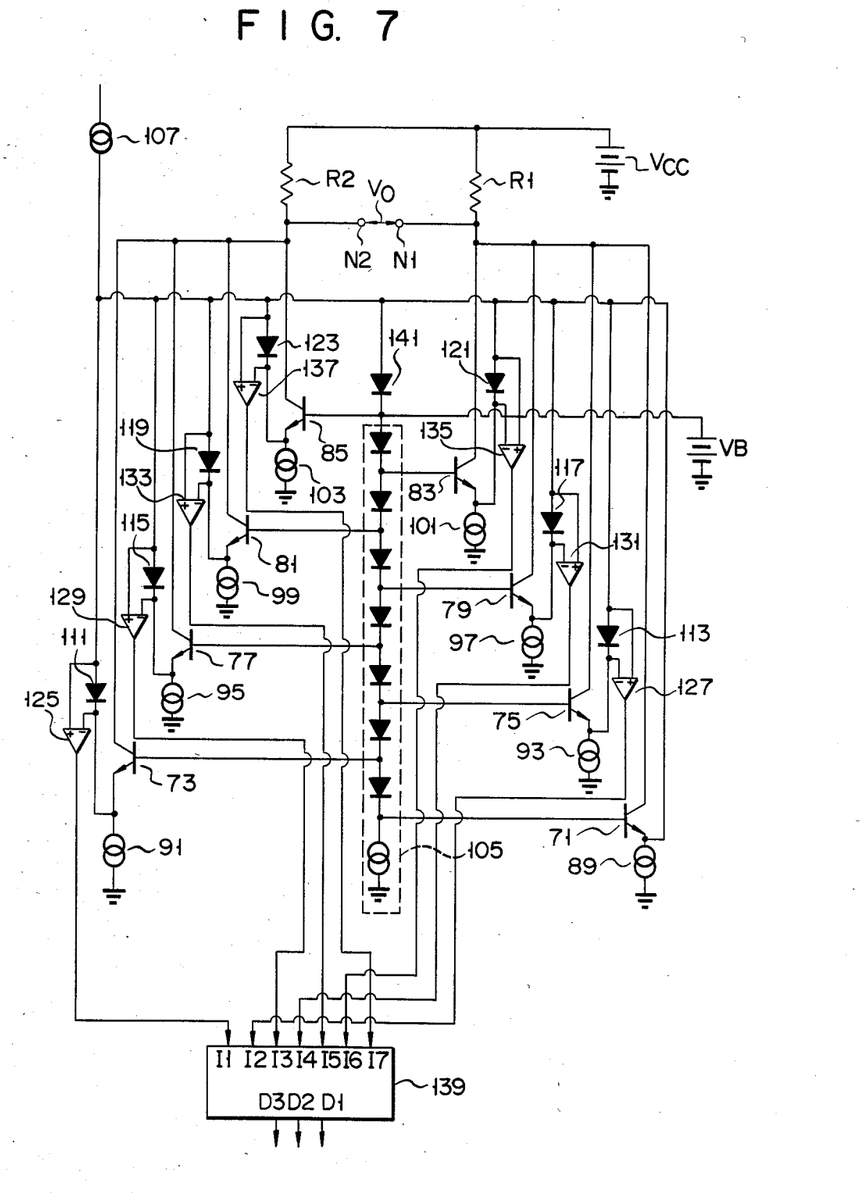
FIGS. 7 and 8 are circuit diagrams illustrating other embodiments of a quantitizer-subtractor circuit according to the present invention.

A quantizer-subtractor circuit capable of producing 3-bit digital signals is illustrated in FIG. 7. As shown, emitters of the transistors 71, 73, 75, 77, 79, 81, 83 and 85 are respectively connected to constant current sources 89, 91, 93, 95, 97, 99, 101 and 103. The bases of those transistors are respectively connected to a bias circuit 105 so as to be applied with different bias voltages. The collectors of the transistors 71, 75, 79 and 83 are connected together to a first load resistor R1. Similarly, the collectors of the transistors 73, 77, 81 and 85 are connected together to a second load resistor R2. The output terminal of the input constant current source 107 for producing the current corresponding to the analog input signal is directly connected to the emitter of the transistor 71, and to the emitters of the transistors 73, 75, 77, 79, 81, 83 and 85 by way of the diodes 111, 113, 115, 117, 119, 121 and 123. Plus input terminals and minus input terminals of the comparators 125, 127, 129, 131, 133, 135 and 137 are connected to the anode and the cathodes of those diodes 111, 113, 115, 117, 119 121 and 123, respectively, as shown. The output terminals of those comparators are connected to the input terminals of an encoder 139. The output signals from the encoder 139 are used as the digital output signals. The subtraction output voltage Vo represents a potential difference between the output terminal N1 connected to the first load resistor R1 and the output terminal N2 connected to the second load resistor R2. The diode 141 is provided for protection purposes.

A quantizer-subtractor circuit capable of producing n-bit digital signals, which uses NPN type transistors will now be given. Constant current sources are respectively connected to the emitters of $2^n$ transistors. Different bias voltages are applied to the bases of those $2^n$ transistors. This is realized by using a bias circuit (similar to bias circuit 47 shown in FIG. 5) composed of a plurality of diodes and the constant current source in series connected to each other. It is as a matter of course that any other known bias circuits are available for this bias circuit. The collectors of the transistors to which the bias voltages with odd-ordered magnitudes are applied are connected together to the first load resistor. Similarly, the collectors of the transistors to which the bias voltages with the even-ordered magnitudes are applied are connected together to the second load resistor. The output terminal of the input constant current source is directly connected to the emitter of the transistor to which the smallest bias voltage is applied, and is connected to the each emitter of the remaining $(2^n-1)$ transistors via the diode. Plus input terminals and minus input terminals of the comparators are respectively connected to the anodes and the cathodes of the $(2^n-1)$ diodes connecting to the emitters of the transistors. The comparators detect the voltages between the cathodes and the anodes of the $(2^n-1)$ diodes. The output terminals of the comparators are connected to the input terminals of an encoder. And the output signals of the comparators are input to the encoder with $(2^n-1)$ input terminals. The subtraction output voltage is produced in the form of the potential difference between the junction of the first load resistor and the transistors, and a junction of the second load resistor and the transistors.

Figure 8:
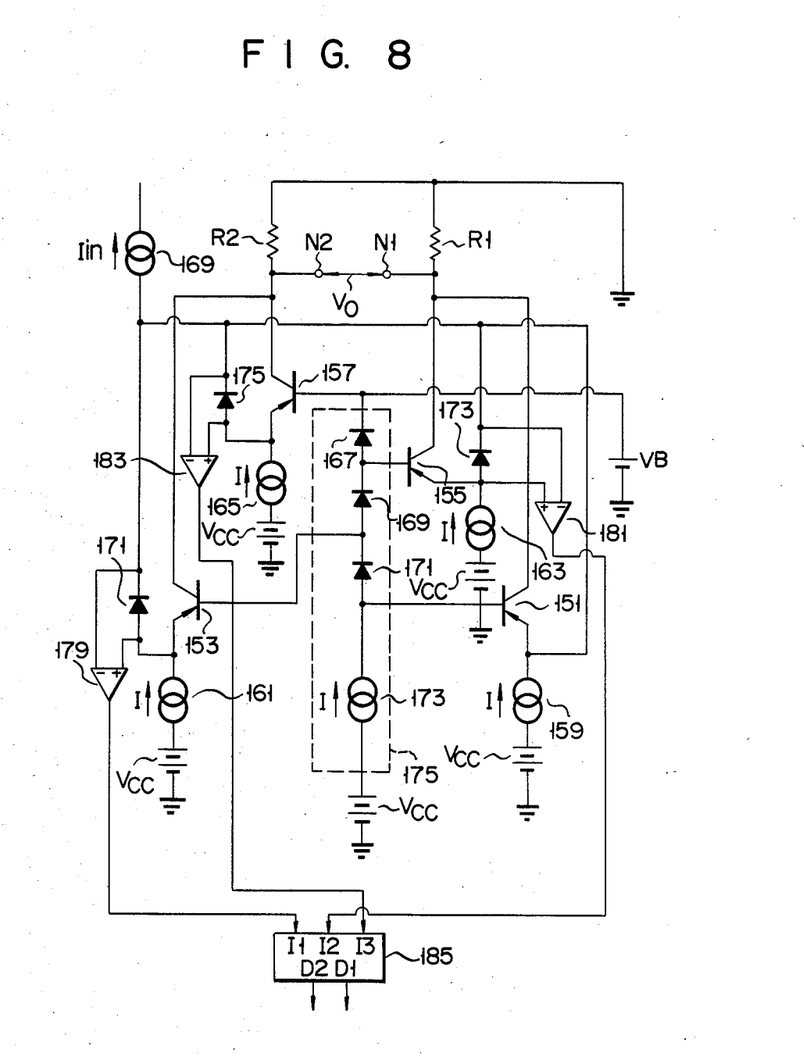

While in the above embodiment $2^n$ NPN type transistors are used, the same number of PNP transistors may be used for implementing the present invention. This will be described referring to FIG. 8 illustrating a quantizer-subtractor circuit with 2-bit digital output signals which uses PNP transistors.

As shown, constant current sources 159, 161, 163 and 165 are respectively connected to transistors 151, 153, 155 and 157. The bases of the transistors 151, 153, 155 and 157 are respectively connected to a bias circuit 175 composed of diodes 167, 169 and 171, and a constant current source 173. The collectors of the transistors 151 and 155 are connected together to the first load resistor R1. Similarly, the collectors of the transistors 153 and 157 are connected to a second load resistor. The input terminal of the input current source 169 is directly connected to the emitter of the transistor 151. The same is connected via diodes 171, 173 and 175 to the emitters of the transistors 153, 155 and 157. The input terminals of the comparators 179, 181 and 183 detect respectively the voltages between the anodes and the cathodes of the diodes 171, 173 and 175. The output terminals of the comparators 179, 181 and 183 are respectively connected to the input terminals of the encoder 185. The output of the encoder 185 is used as a digital output. The subtraction output voltage Vo is the potential difference between the output terminal N1 which is connected to the first load resistor R1 and the output terminal N2 which is connected to the second load resistor R2.

A quantizer-subtractor circuit capable of producing n-bit digital signals and using PNP transistors will now be given. Constant current sources are connected to the emitters of $2^n$ transistors. Different bias voltages are applied to the bases of those transistors. The collectors of the transistors to which the bias voltages with odd-ordered magnitudes are applied are connected together to the first load resistor. Similarly, the collectors of the transistors to which the bias voltages with the even-ordered magnitudes are applied are connected together to the second load resistor. The output terminal of the input constant current source is directly connected to the emitter of the transistor to which the largest bias voltage is applied. And the input terminal of the input constant current source is connected to each emitter of the remaining transistors via the diode. Plus input terminals and minus input terminals of the comparators are connected to the anodes and the cathodes of the ($2^n-1$) diodes connecting the emitters of the transistors. The comparators detect the voltages between the cathodes and the anodes of the diodes, and input them to the encoder with ($2^n-1$) input terminals. The subtraction output voltage Vo is produced in the form of the potential difference between the junction of the first load resistor and the transistors, and a junction of the second load resistor and the transistors. Of course, transistors with shorted bases and collectors may be used instead of diodes.

In the above-mentioned embodiments, the voltage drops across the diodes which are connected to the emitters of the transistors are detected by the comparators. The detected voltage drops are encoded by the encoder to have digital output signals. It should be understood that the present invention is not limited to this. The digital output can be obtained by checking whether or not the currents flowing into the transistors each have a predetermined value I. An additional A/D converter may be provided and selected as needed.

The analog input current source is not always needed. For example, when the input signal takes the form of a current signal, the analog input current source is unnecessary.

What is claimed is:

1. A quantizer-subtractor circuit comprising:
   analog signal inputting means for inputting an analog input signal;
   digital signal outputting means for producing a digital signal corresponding to said analog input signal input by said analog signal inputting means;
   $2^n$ NPN transistors, where n is a positive integer;
   bias means connected to said $2^n$ transistors for supplying different odd-ordered and even-ordered magnitudes of bias voltages to the base of each of said $2^n$ transistors;
   controlling means connected to said $2^n$ transistors and said analog signal inputting means for controlling current passing through said $2^n$ transistors based on said analog input signal input and on said bias voltages applied to the bases of said $2^n$ transistors by said bias means, said controlling means including constant current sources coupled to the emitters of said $2^n$ transistors,
   a circuit connecting said analog signal inputting means to the emitter of the one of said $2^n$ transistors having the smallest of said different bias voltages, and
   $2^n-1$ diode means for connecting said analog signal inputting means to the $2^n-1$ of said $2^n$ transistors not having the smallest of said bias voltages; and
   analog signal producing means for producing an analog signal corresponding to the difference between the sum of the currents flowing through those of said $2^n$ transistors supplied with bias voltages with odd-ordered magnitudes by said bias means, and the sum of the currents flowing through those of said $2^n$ transistors supplied with the bias voltages with even-ordered magnitudes by said bias means, in order that an analog signal corresponding to the difference between the value of said analog input signal input by said analog signal inputting means and the value corresponding to the digital signal output by said digital signal outputting means is produced as a subtraction output.

2. A quantizer-subtractor circuit according to claim 1, in which said bias means comprises a plurality of diodes connected in series in the same direction, and a constant current source connected in series with said plurality of diodes.

3. A quantizer-subtractor circuit according to claim 1, in which said analog signal producing means comprises a first resistor connected to the collectors of first ones of said $2^n$ transistors which are supplied with bias voltages of the odd-ordered magnitudes by said bias means, a second resistor connected to the collectors of second ones of said $2^n$ transistors which are supplied with bias voltages of the even-ordered magnitudes by said bias means, a first output terminal connected to a connection point between said first resistor and the collectors of said first transistors, and a second output terminal connected to a connection point between said second resistor and the collectors of said second transistors.

4. A quantizer-subtractor circuit according to claim 1, in which said digital signal outputting means comprises detecting means for detecting the currents flowing through said ($2^n-1$) diodes in said controlling means, and means for outputting a digital signal on the basis of the currents detected by said detecting means.

5. A quantizer-subtractor circuit according to claim 1, in which said analog signal inputting means includes analog current outputting means for producing an analog input current corresponding to said analog input signal, and
   said controlling means controls the current flowing through the emitter-collector path of each of said $2^n$ transistors corresponding to said analog input current output from said analog current outputting means and to said bias voltages applied to the bases of said $2^n$ transistors by said bias means.

6. A quantizer-subtractor circuit comprising:
   analog signal inputting means for inputting an analog input signal;
   digital signal outputting means for producing a digital signal corresponding to said analog input signal input by said analog signal inputting means;
   $2^n$ PNP transistors, where n is a positive integer;
   bias means connected to said $2^n$ transistors for supplying different odd-ordered or even-ordered magnitudes of bias voltages to the base of each said $2^n$ transistors;
   controlling means connected to said $2^n$ transistors and said analog signal inputting means for controlling current passing through said $2^n$ transistors based on said analog input signal and on said bias voltages applied to the bases of said $2^n$ transistors by said bias means, said controlling means including constant current sources coupled to the emitters of said $2^n$ transistors,
   a circuit connecting said analog signal inputting means to the emitter of the one of said $2^n$ transistors having the highest of said different bias voltages, and
   $2^n-1$ diode means for connecting said analog signal inputting means and the emitters of the $2^n-1$ of said $2^n$ transistors not having the highest of said bias voltages; and
   analog signal producing means for producing an analog signal corresponding to the difference between the sum of the currents flowing through those of said $2^n$ transistors supplied with bias voltages with odd-ordered magnitudes by said bias means and the sum of the currents flowing through those of said $2^n$ transistors supplied with the bias voltages with even-ordered magnitudes by said bias means, in order that an analog signal corresponding to the difference between the value of said analog input signal and the value corresponding to the digital signal output by said digital signal outputting means is produced as a subtraction output.

7. A quantizer-subtractor circuit according to claim 6, in which said digital signal outputting means comprises detecting means for detecting the currents flowing through said $(2^n-1)$ diodes in said controlling means, and means for outputting a digital signal on the basis of the currents detected by said detecting means.

8. A quantizer-subtractor circuit according to claim 6 wherein said bias means comprises a plurality of diodes connected in series in the same direction and a constant current source connected in series with said plurality of diodes.

9. A quantizer-subtractor circuit according to claim 6 wherein said analog signal producing means comprises a first resistor connected to the collectors of first ones of said $2^n$ transistors which are supplied with bias voltages of the odd-ordered magnitudes by said bias means, a second resistor connected to the collectors of second ones of said $2^n$ transistors which are supplied with bias voltages of the even-ordered magnitudes by said bias means, a first output terminal connected to a connection point between said first resistor and the collectors of said first transistors, and a second output terminal connected to a connection point between said second resistor and the collectors of said second transistors.

10. A quantizer-subtractor circuit according to claim 6 wherein said analog signal inputting means includes analog current outputting means for producing an analog input current corresponding to said analog input signal, and wherein said controlling means controls the current flowing through the emitter-collector path of each of said $2^n$ transistors corresponding to said analog input current output from said analog current outputting means to said bias voltages applied to the bases of said $2^n$ transistors by said bias means.

* * * * *